(12) United States Patent
Keller et al.

(10) Patent No.: US 6,323,493 B1
(45) Date of Patent: Nov. 27, 2001

(54) INCREASED ION BEAM THROUGHPUT WITH REDUCED BEAM DIVERGENCE IN A DIPOLE MAGNET

(75) Inventors: John H. Keller; Kathleen J. Keller, both of Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/383,772

(22) Filed: Aug. 26, 1999

(51) Int. Cl.$^7$ .................................................. H01J 37/00
(52) U.S. Cl. ................................................. 250/396 ML
(58) Field of Search ......................... 250/396 ML, 396 R, 250/492.21, 492.2, 492.3, 309

(56) References Cited

U.S. PATENT DOCUMENTS 5,206,516 * 4/1993 Keller et al. ..................... 250/396 R

* cited by examiner

Primary Examiner—Kiet T. Nguyen
(74) Attorney, Agent, or Firm—McGuireWoods, LLP

(57) ABSTRACT

Spreading of an ion beam when passing through a dipole magnet is reduced or suppressed by electrostatic ion beam confinement which supplements magnetic confinement which may be provided. The magnetic confinement is enhanced by the provision of a magnetic mirror through concentration and localized increase of the dipole field with a concave profile of the pole pieces faces and/or provision of permanent magnets or localized regions of material of increased permeability to form magnetic cusps. Pitch and geometry of convex portions of the pole piece faces are adjusted to increase the mirror ratio and the location of the maximum mirror field relative to the thickness of a graphite or insulating liner which may be employed. Electrostatic confinement elements in the form of negatively charged electrodes and/or electrically isolated electrodes or insulators which assume a negative charge. Ionization of plasma between the pole pieces may be enhanced by application of a VHF/UHF field having a frequency of about 40 MHz to 100 MHZ or higher.

23 Claims, 10 Drawing Sheets

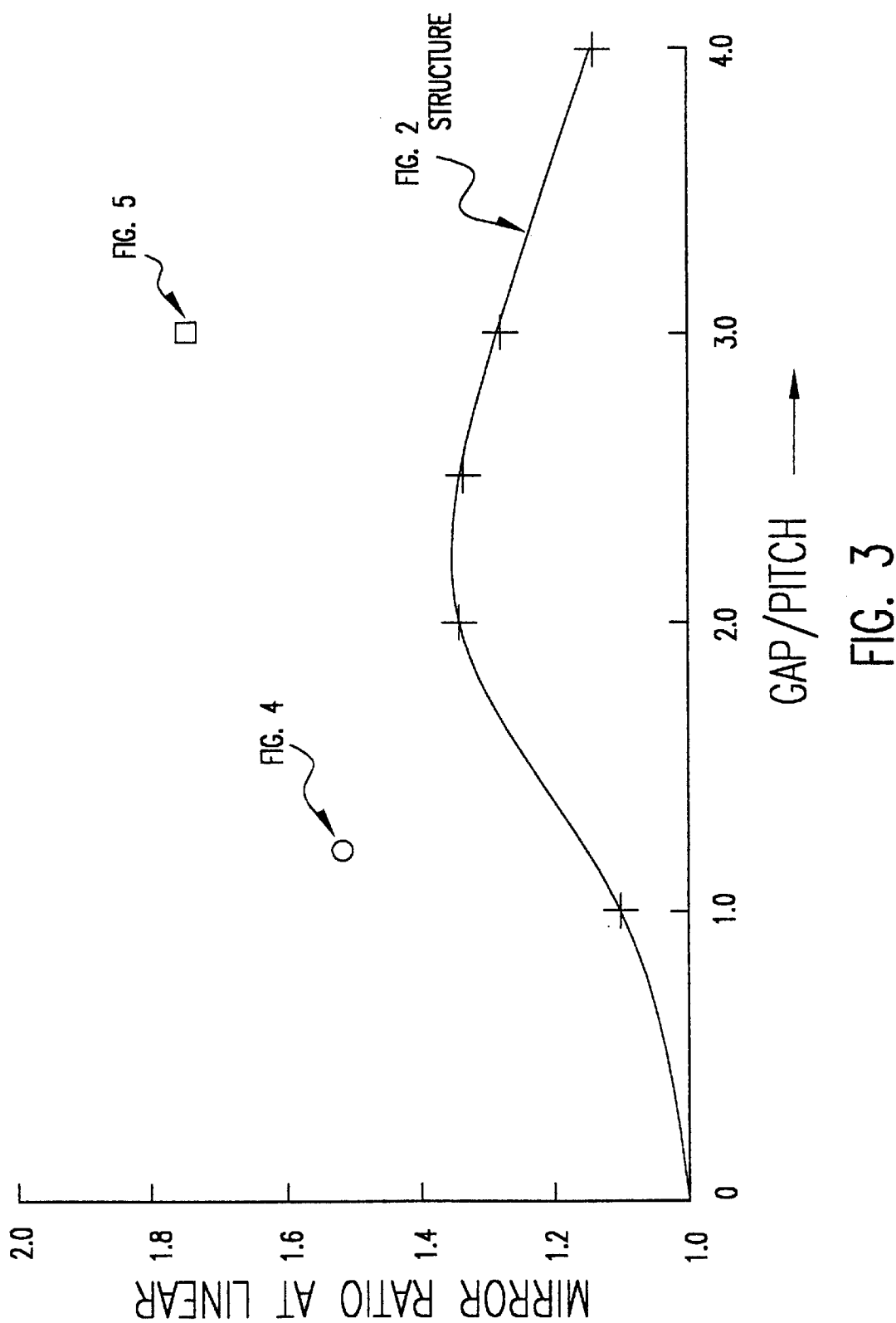

INCREASED ION BEAM THROUGHPUT WITH REDUCED BEAM DIVERGENCE IN A DIPOLE MAGNET

BACKGROUND OF THE INVENTION

1. Field of the Invention

The present invention generally relates to apparatus employing charged particle beams and, more particularly, to ion beam apparatus employing magnets to manipulate the ion beam.

2. Description of the Prior Art

The art of semiconductor electronic device manufacture has become highly sophisticated in recent years to provide a wide range of electrical properties of the devices, often at very high integration density. The capability to determine the electrical properties with high reliability, consistency and manufacturing yield is often limited, as a practical matter, by the tools used for processing the semiconductor material, usually in the form of a wafer. Such tools are often complex and of high precision. Therefore such tools are generally expensive to build and maintain. The principal expense of modern semiconductor devices is thus a portion of the cost of the tools used to produce them and, therefore, varies inversely with tool throughput.

As is generally known, pure semiconductor materials are poor conductors of electricity but, as such, the electrical properties of semiconductor materials can be altered radically by impurities and/or electrical fields established therein; the latter being generally used for control of the device while the former is generally used for establishing device specifications. Impurities can be introduced into semiconductor materials either during growth or deposition or by implantation. Implantation is often preferred for high precision of placement of the impurities and process simplicity. That is, implantation of particles in the form of ions can accurately place impurities at a desired depth within an existing structure in accordance with the energy (or, more accurately, the distribution of energies) imparted to the particles to be implanted and the nature of the material in which the particles are to be implanted. By the same token, impurities may be implanted into an existing structure in a single process whereas at least two growth or deposition processes would be required to form a buried layer having impurities therein.

It should be appreciated that the distribution of energies of the particles, often referred to simply as beam energy, is dictated by the device design (e.g. where the impurities are to be placed) as is the concentration of impurities to be achieved. The desired concentration of impurities is determined as a function of charged particle flux at the surface of the semiconductor material or target and the duration of the implantation process. It follows that the energy of the beam cannot be altered to increase particle flux and thereby reduce the duration of the implantation process. Accordingly, the desired concentrations of impurities may require substantial time to achieve; thereby reducing tool throughput and increasing expense.

Unfortunately, several physical mechanisms of ion beams tend to substantially reduce ion flux. Specifically, it is common practice to use a magnetic field to control or manipulate the ion beam. One particular such manipulation is referred to as mass analysis. In the mass analysis process, ions will have the same charge and their motion along the beam path represents a current. Therefore, when such charged particles pass through a magnetic dipole, a force is exerted on each ion perpendicular to both. the direction of the beam and the direction of the magnetic field. Due to this force, the trajectory of each ion is altered to a degree inversely proportional to the square root of its mass. This effect allows removal of ions from the beam which are not of the desired material and the remainder of the beam will be limited to ions of a particular mass. This type of structure is routinely included in ion beam tools for that reason and the reduction of ion flux in the beam by removal of ions of undesired materials is not of concern.

However, in the magnetic dipole gap of the mass analysis magnet or any other magnet in the tool, the ion beam tends to diverge significantly in a manner similar to effects of Coulomb interactions between ions (sometimes referred to as "space charge blow up") even when the ion beam energy is sufficiently great to create a plasma within the magnet. (Presence of a plasma including free electrons tends to reduce the repulsion forces between ions in the beam, sometimes referred to as space charge neutralization.) Even though the mechanism of beam divergence may not be fully or accurately understood, beam divergence within the magnet is known to be significantly greater than in a comparable length of unmagnetized beam line (provided there are no electrodes along that length of beam line that would destroy the beam plasma). It is generally believed, however, that the increase in beam divergence is due to an increase in electron temperature within the beam plasma in the magnet relative to plasma electron temperature outside the magnet.

The divergence of the beam within the magnet is also principally in the direction of the magnetic field (e.g. across the gap between the pole pieces) and, at the same time, the transverse size of the beam is limited by the size of the pole gap thus reducing flux by the truncation of the edges of the beam as ions impinge upon the pole pieces. The beam divergence increases with increased ion beam current and decreased beam energy. At low beam energies, the ion beam is less effective to produce ionization which would, in turn, produce a beam plasma that partially compensates for the space charge of the ion beam. Therefore, it can be seen that seeking to increase tool throughput by increasing beam current provides only marginal, if any, advantage since increased beam current increases beam divergence and loss of ion flux in the magnet and at the target which largely counteracts the increase of beam current. Further, the spreading effect is aggravated at low beam energies and particularly at high currents.

In a plasma outside of a dipole magnet, it is well-known to confine the plasma and reduce the electron temperature by confining the electrons magnetically with a multi-pole magnetic structure. In such a structure, the electrons are confined by a large mirror ratio at magnetic cusps. However, when a multi-pole field is combined with a dipole field as disclosed, for example, in U.S. Pat. No. 5,206,516, either the electrons are confined by a cusp at one side of the dipole field but the field is decreased at the other side of the dipole field or, if the electrons are confined by cusps at both sides of the dipole field, the region of the cusps will be followed, along the beam line, by a region of reduced magnetic field. Thus, very little net confinement is achieved in either case.

Accordingly, it is seen that there has been, prior to the present invention, no known technique for increasing ion beam tool throughput since neither increase of ion beam current nor magnetic confinement with a multi-pole structure provides a significant increase in ion beam flux at the target.

SUMMARY OF THE INVENTION

It is therefore an object of the present invention to provide a technique for reducing ion beam divergence in dipole magnet structures.

It is another object of the invention to provide increased ion beam currents in ion beam tools.

It is a further object of the invention to provide dipole magnet structures with much reduced ion beam divergence and improved plasma and/or electron confinement.

It is another further object of the invention to provide a dipole magnet structure through which increased ion beam currents can be passed.

It is yet another object of the invention to provide additional ionization in the beam plasma for low energy beams and low beam pressures.

In order to accomplish these and other objects of the invention, an apparatus utilizing an ion beam and including a dipole magnet for manipulating the ion beam is provided wherein the dipole magnet includes a gap between pole pieces of the dipole magnet through which the ion beam passes, and a plurality of electrodes or insulators for maintaining a negative charge disposed within the gap between the pole pieces of the dipole magnet. The negative charge thus confines electrons in the plasma to neutralize the space charge of the ion beam and thus reduces beam spreading and loss of ions to the pole pieces.

In accordance with another aspect of the invention, an ion beam apparatus having a dipole magnet and a beam plasma inside a gap of the dipole magnet is provided, comprising an arrangement for increasing magnetic fields near the pole faces of the dipole magnet, and an arrangement for electrostatically confining said ion beam at a plurality of locations along said pole faces in a direction of ion beam travel to provide additional electrostatic confinement of electrons, particularly where magnetic fields are reduced.

In accordance with a further aspect of the invention, a method for reducing ion beam divergence in a gap of a dipole maget is provided comprising the steps of increasing a magnetic field of the dipole magnet in a region near its pole faces and electrostatically confining a beam plasma at a location along the pole faces in a direction of ion beam travel where the magnetic field is reduced.

BRIEF DESCRIPTION OF THE DRAWINGS

The foregoing and other objects, aspects and advantages will be better understood from the following detailed description of a preferred embodiment of the invention with reference to the drawings, in which:

FIGS. 2A, 4A and 5A are substantially identical to FIGS. 2, 4 and 5, respectively, but additionally show magnetic field lines.

DETAILED DESCRIPTION OF A PREFERRED EMBODIMENT OF THE INVENTION

Figure 1:
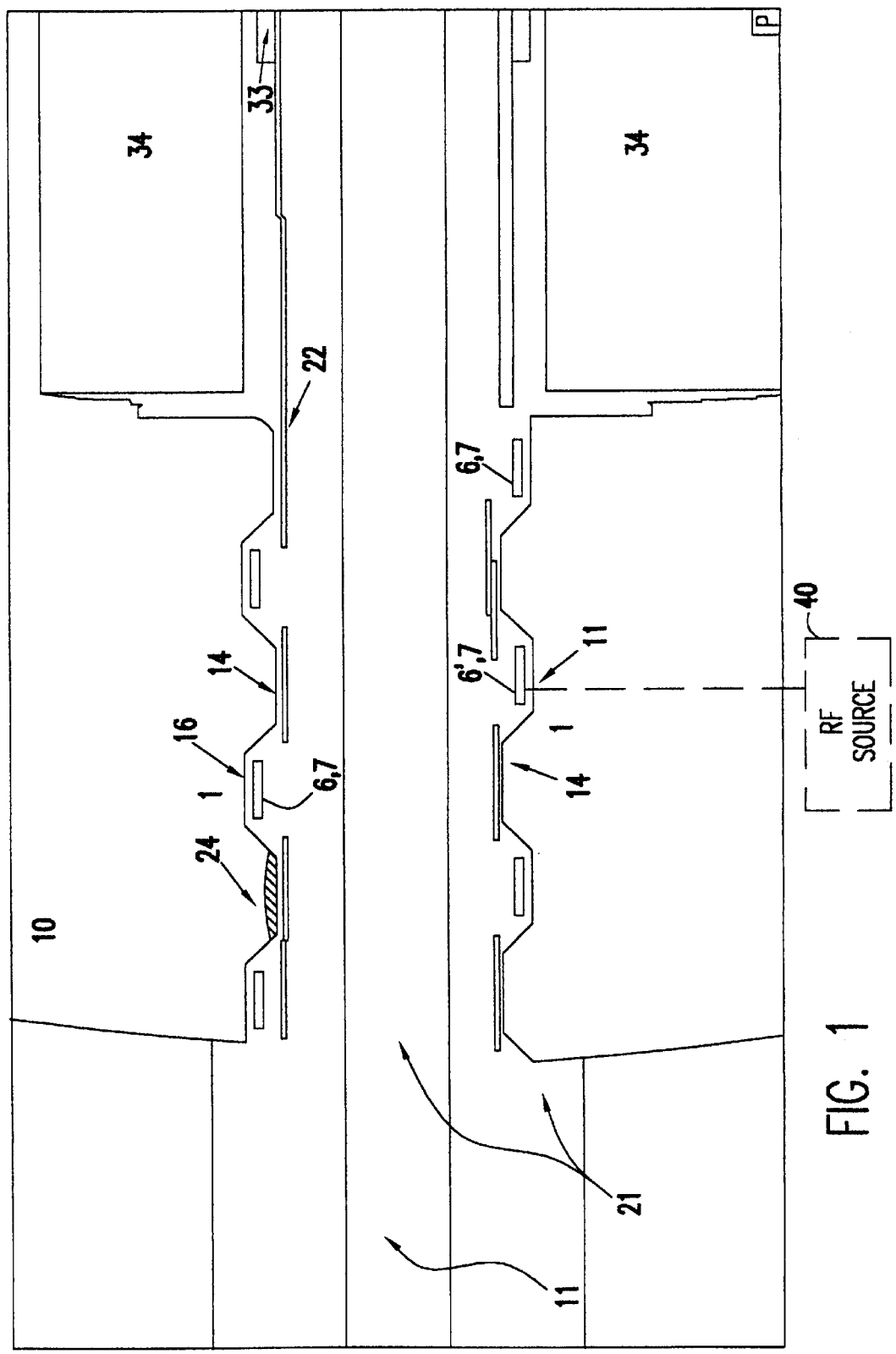
FIGS. 1 and 1A are cross-sectional views of an embodiment of the invention in which the beam is confined magnetically on only one side at any point between the dipole pole pieces and electrostatic confinement is provided at opposing regions across the gap.
Figure 1A:
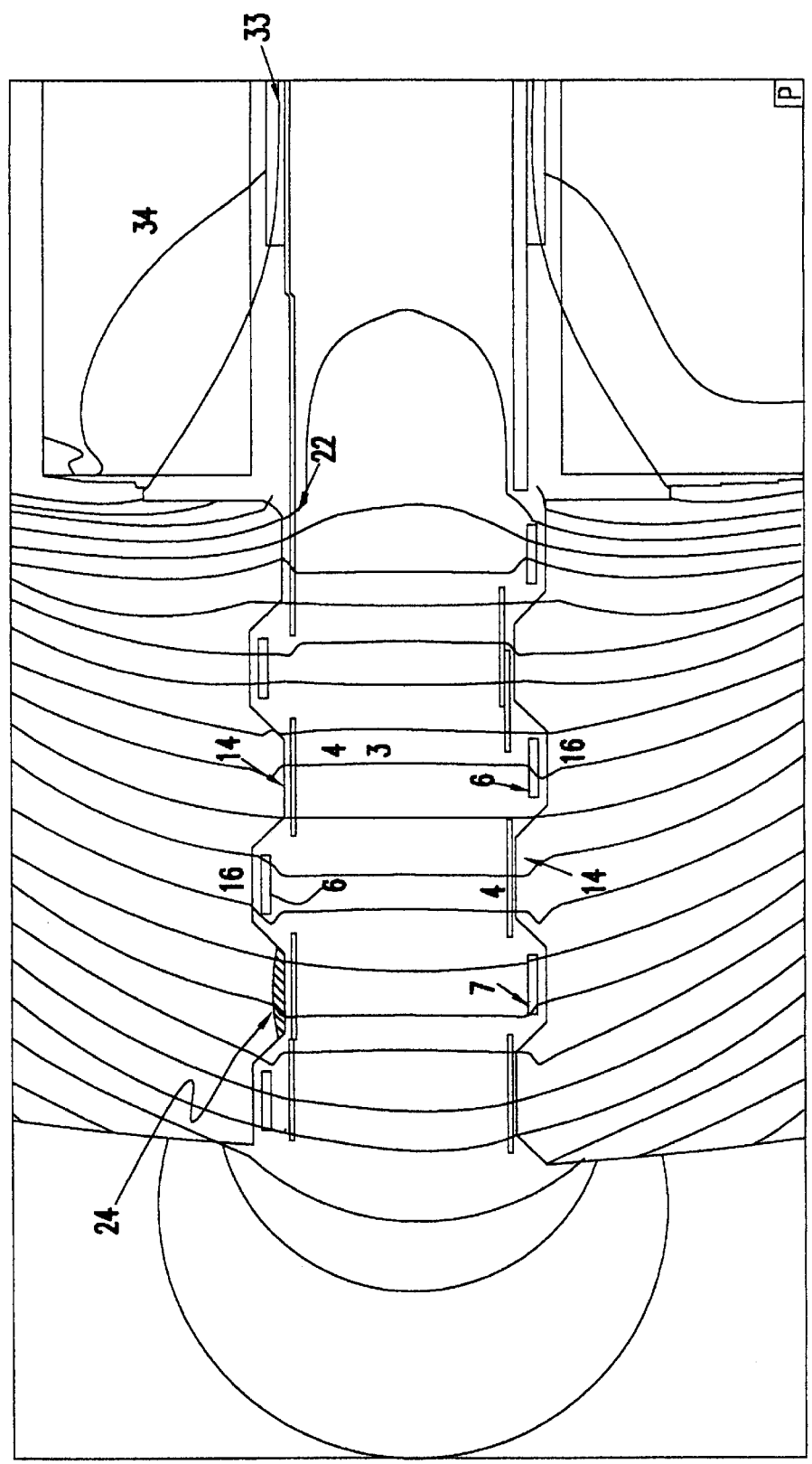

Referring now to the drawings, and more particularly to FIGS. 1 and 1A, there is shown, in cross section, the gap of a dipole magnet such as may be used for mass analysis or any other manipulation of the ion beam in accordance with one exemplary embodiment of the invention. The magnetic field pattern is depicted in FIG. 1A to aid in visualization of the principles of the invention but omitted from FIG. 1 in the interest of clarity.

It should be understood that in an ion beam transport system in which the beam is travelling near the local ground potential or where there are no electrodes to draw off electrons, the ion beam will produce a beam plasma by ionization of the background neutral gas. The number of ions and electrons produced to form the plasma will depend on the pressure of the background gas and the beam energy. In general, the beam plasma will partially fill the beam line or beam raceway which is provided to surround the beam. It will thus be in the region of the beam and serves to reduce the effects of the space charge of the ion beam which cause the beam to diverge.

In FIGS. 1 and 1A, a part of a dipole magnet 10 is shown in cross-section with ion beam 11 passing between the pole pieces 1. The pole pieces 1 are formed with convex regions 14 and concave regions 16. These formations serve to concentrate the magnetic field at regions 14 to form cusps, as may be observed from the depiction of magnetic field lines 3 converging at convex regions 14 in FIG. 1A. A similar effect or enhancement thereof can be produced by the placement of magnetic material (e.g. permanently magnetized or higher permeability material such as samarium or cobalt) in similar locations on the pole piece faces. These cusps serve to magnetically confine electrons in the beam plasma by virtue of the increased magnetic field near the beam raceway surface relative to the field at the axis of the beam which tends to reflect electrons having a trajectory component toward the cusps and away from the beam.

Concave regions 16 are preferably provided since their complementarity to convex regions 14 increases the mirror ratio of the magnetic confinement and the recess provided by the concave profile accommodates the electrodes or insulators which will be used for electrostatic confinement in accordance with the invention without reduction of the width of the beam raceway. Further, the recess provided by the concavity allows the potential sheaths of electrodes and/or insulators 6, 7 to be completely outside of the ion beam.

In the embodiment of FIGS. 1 and 1A, convex portions 14 of the pole piece faces 1 are located opposite concave regions 16 across the raceway so that the magnetic confinement is only on one side of the beam plasma at any given location along the beam path. Opposite convex regions 14 and at concave regions 16 the electrons are electrostatically confined in accordance with the invention.

The electrostatic confinement is accomplished by negative electrodes 6 or isolated electrodes or insulators 7. If isolated electrodes and/or insulators are used, the greater diffusivity of the electrons in the plasma will cause the isolated electrodes and/or insulators 7 to charge negatively as electrons from the plasma are incident thereon and accumulated. Therefore a negative charge on either electrodes 6 or isolated electrodes and/or insulators 7 will cause electrons in the plasma to be repelled and thus confined electrostatically at location where the electrons are not confined magnetically by (and opposite to) the cusps and transverse field lines of the magnetic field across the dipole gap. That is, in the embodiment of FIGS. 1 and 1A, the electrons will be confined in one direction by the mirror fields 4 and, in the opposite direction, the electrons will be confined electrically (e.g. electrostatically). These two directions and modes of confinement will alternate along the faces of the pole pieces in the direction of the beam and motion of ions therein.

As a perfecting feature of the invention but not necessary to the successful practice thereof, an optional raceway liner 22, preferably of graphite, can be provided to reduce contamination due to the ion beam sputtering the pole faces 1. The raceway liner 22 should have open regions adjacent regions where electrical confinement of electrons in the beam plasma is performed. The raceway liner 22 is connected to a local ground to avoid charging by accumulation of electrons thereon.

As another perfecting feature of the invention which extends the applicability and performance of the invention but is not necessary to its practice in accordance with its basic principles, the negative voltage applied to electrodes 6 can be modulated with a high frequency (e.g. radio frequency (RF), preferably in the 40 MHz–100 MHz range or possibly higher) voltage, as depicted at 40 of FIG. 1, or a high frequency-electric field similarly superimposed thereon by electrodes 6' in addition to negatively charged electrodes 6 and/or isolated electrodes and/or insulators 7 to increase ionization and plasma particle density. That is, for conditions of low ion beam energy and/or low pressure of background gas, additional ionization beyond that provided by the ion beam, itself, can be developed by the provision of a radio frequency electric field. The additional ionization reduces beam divergence, as alluded to above, under conditions such as low beam energy where beam divergence would otherwise be relatively more severe.

A further perfecting feature shown in FIGS. 1 and 1A is the optional inclusion of field clamps 33 that preferably extend within the dipole magnet coil 34. The field clamp 33, if employed, is essentially a magnetic shield for reducing the magnetic field outside of pole faces 1, assisting in the reduction of electron temperature outside the dipole gap.

It should be appreciated that any or all of the perfecting features discussed above can be employed, as desired, in any or all of the disclosed exemplary embodiments of the invention described below and illustrated in FIGS. 2 and 4–6 as well as all variations thereof. Accordingly, discussion of these features in regard to the following exemplary embodiments is unnecessary.

Figure 2:
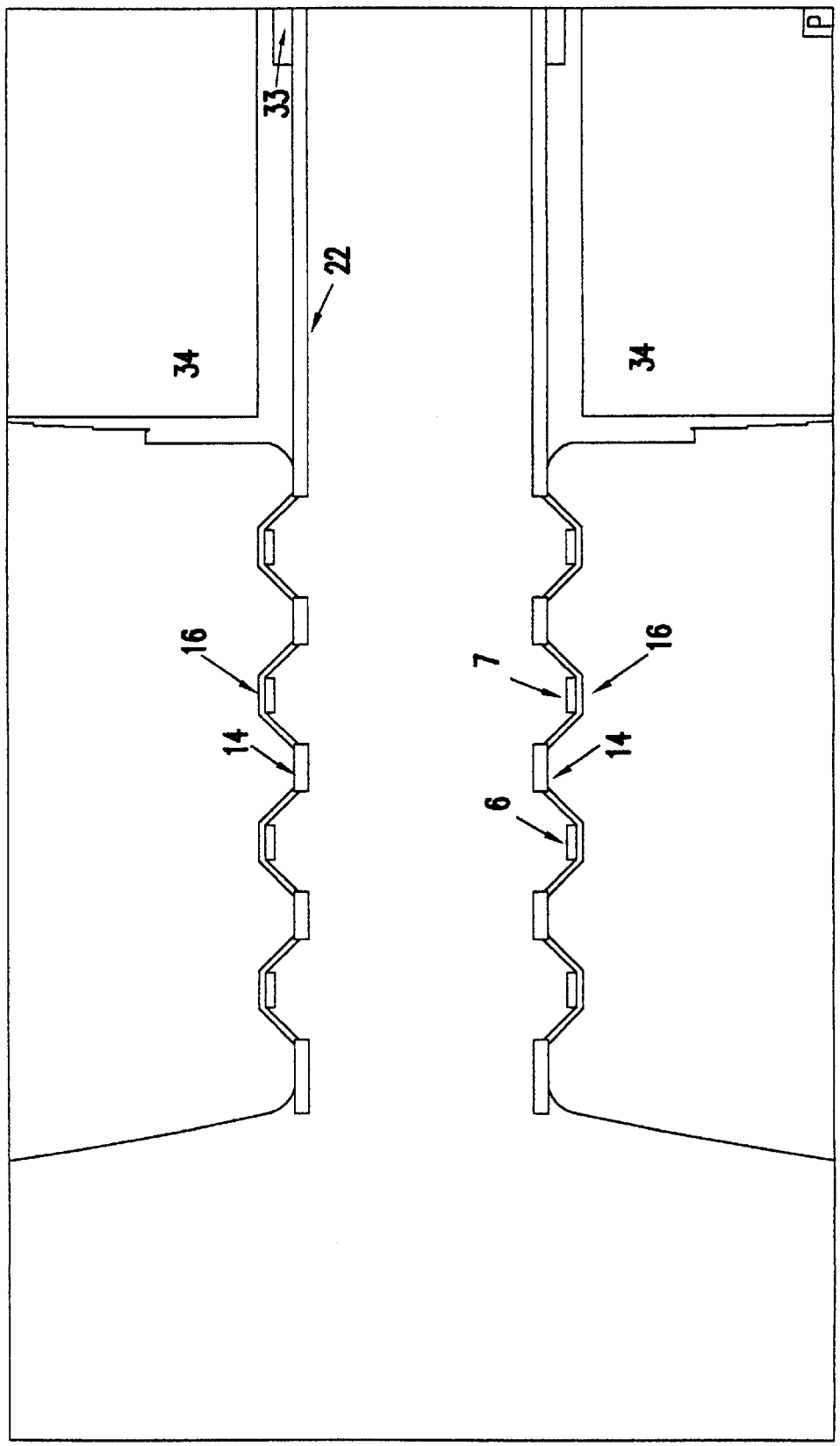
FIGS. 2 and 2A are cross-sectional views of an embodiment of the invention in which the ion beam is confined magnetically and electrostatically in alternating regions along the beam path, FIG. 3 graphically illustrates the mirror ratio at the liner of various embodiments of the invention.
Figure 2A:
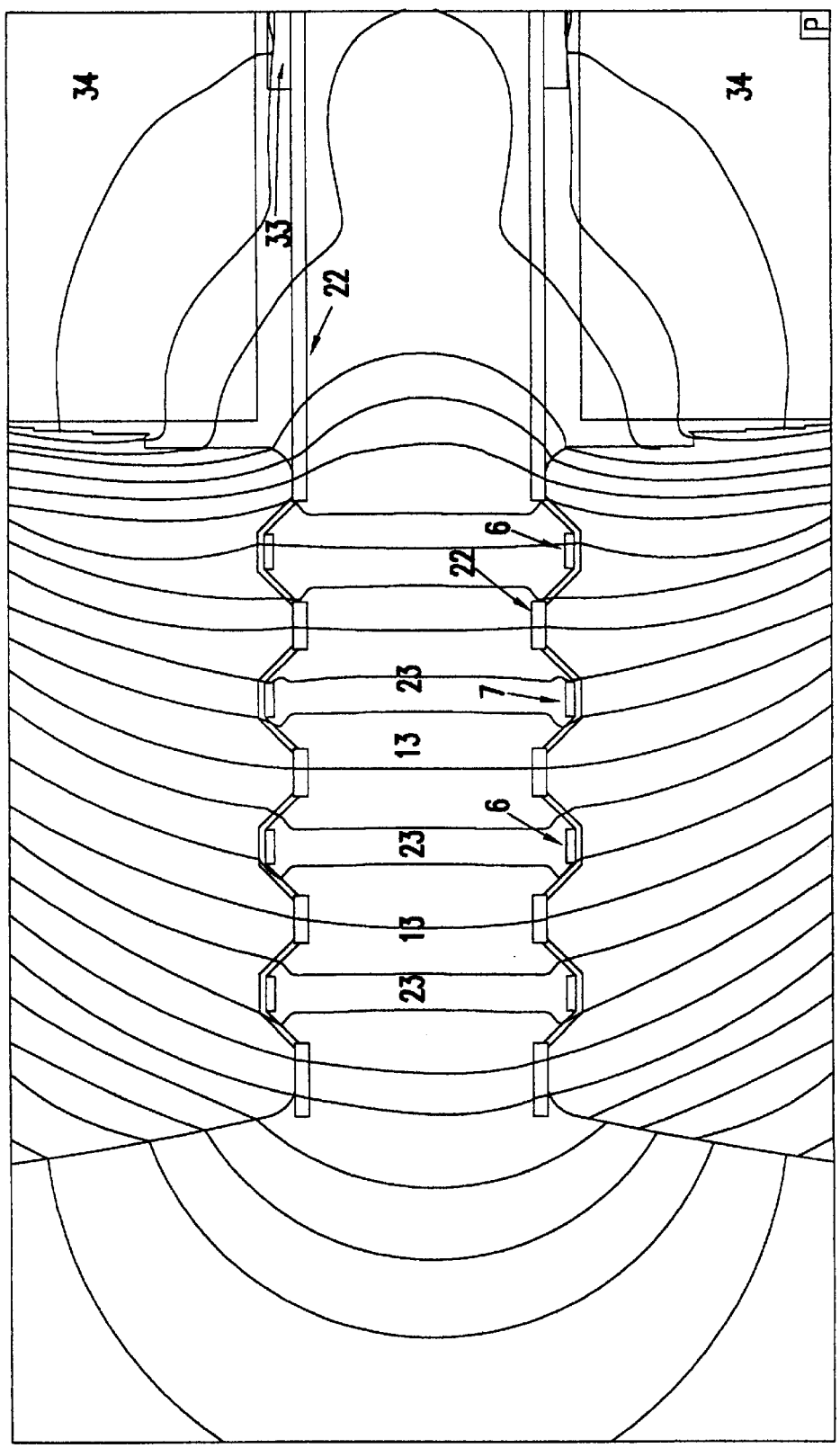

Referring now to FIGS. 2 and 2A, a second embodiment in accordance with the invention is shown in cross-sectional views similar to those of FIGS. 1 and 1A, respectively. (Reference numerals used in FIGS. 1 and 1A will be used to identify corresponding structure in other Figures.) This embodiment differs from the embodiment of FIGS. 1 and 1A principally by the convex regions 14 and concave regions 16 being directly opposed across the magnet gap and ion beam raceway. In this case, each of the magnetic cusps which provides magnetic mirror containment of the plasma electrons is directly opposite another cusp and each pair of cusps serves to contain the plasma electrons from both sides of the beam in regions 13. Between pairs of cusps, the electrons are confined electrostatically by electrodes, isolated electrodes or insulators 6, 7, from both sides of the beam in regions 23.

It should be appreciated in this embodiment that the electrons in region 23 are also confined from regions 13 by magnetic field lines 3. However, low energy electrons (which have many more collisions than hotter electrons) can move (e.g. diffuse) from region 23 to region 13. (The hot electrons set up a high frequency field that allows cold electrons but not hot electrons to diffuse across the boundary of these regions.) Thus regions 13 will have colder electrons than in regions 23 and, consequently, reduced beam spreading.

FIG. 3 is a graph of the mirror ratio developed by the cusps of the embodiments of FIG. 2A as a function of the magnet gap to cusp spacing or pitch (e.g. the ratio of the "vertical" spacing of regions 14 to the center-to-center "horizontal" spacing of regions 14 across concave regions 16) at a particular distance from the face of the pole pieces. The mirror ratio is the ratio of the magnetic field strength at the inner surface of the beam raceway (e.g. 22) to the magnetic field strength at the center of the beam raceway. The mirror ratio is a measure or figure of merit indicating the quality or effectiveness of magnetic plasma electron confinement.

The curve of FIG. 3 illustrates that the smaller the cusp pitch, the larger the mirror ratio but that the distance above the faces of the pole pieces where the mirror ratio is maximized also becomes closer to the pole piece faces and may actually occur within the thickness of the liner, if used, resulting in the reduction of the mirror ratio at the surface of a liner of given thickness as the pitch is reduced beyond a dimension corresponding to location of the maximum mirror field at the liner surface.

Further, if the length of concave region 16 (e.g. the portion of the pitch of regions 14, which is the sum of the "horizontal lengths of a region 14 and a region 16) is increased relative to the ("horizontal") length of each convex region 14, the mirror ratio can be increased because the magnetic field near the pole piece faces will become more concentrated as regions 14 become more narrow. At same time, however, depending on the depth of concave regions 16, the average gap length (and magnetic circuit reluctance) will be increased, decreasing field strength in the gap for a given excitation of coil 34. This effect and exploitation thereof in preferred embodiments of the invention will be discussed in regard to the embodiments of FIGS. 4 and 5 which derive increased mirror ratios by variation of cusp geometry and pitch.

Figure 4:
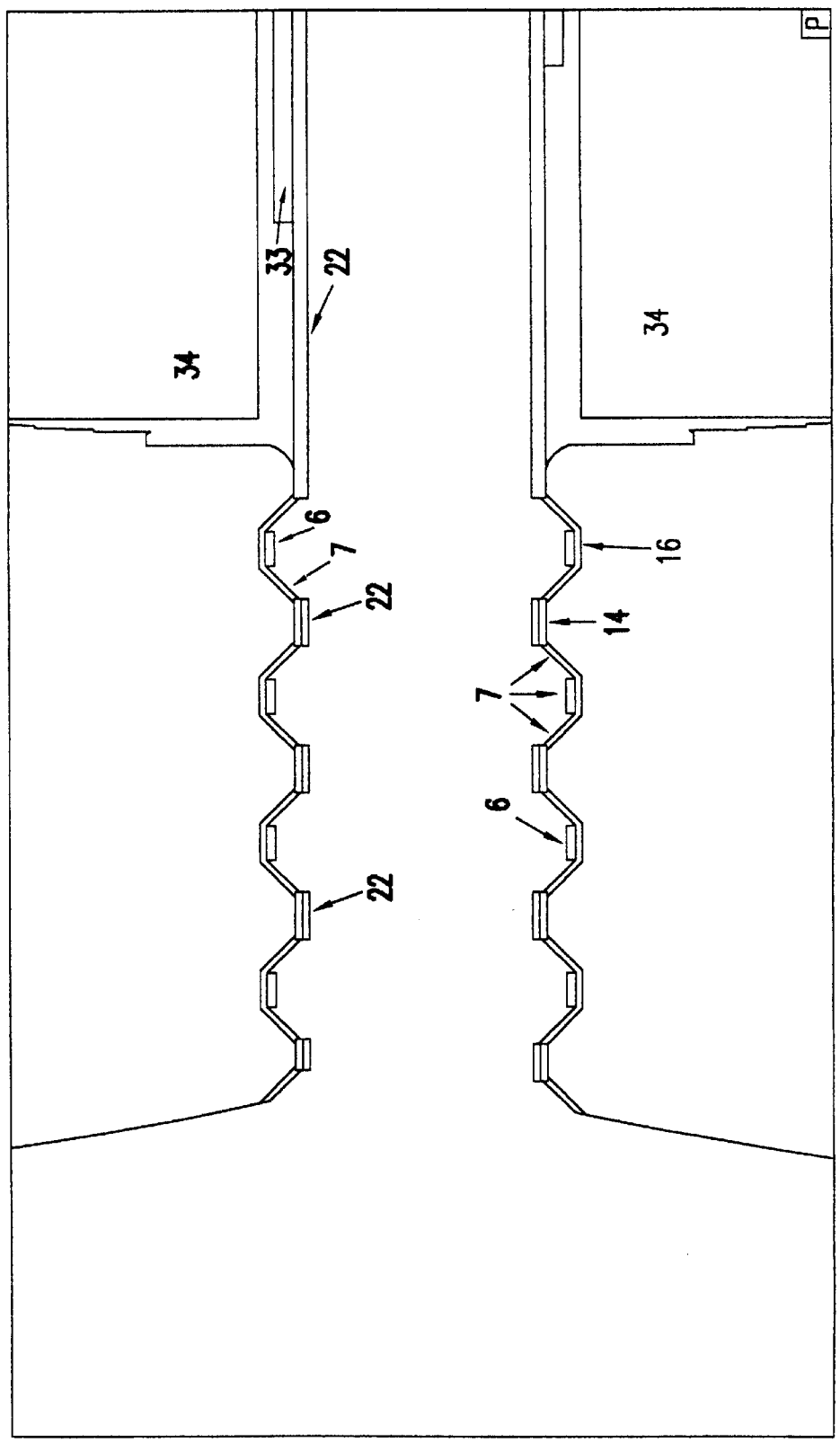
FIGS. 4 and 4A illustrate a variation of the embodiment of FIGS. 2 and 2A, FIGS. 5 and 5A illustrate a further variation of the embodiment of FIGS. 2 and 2A.
Figure 4A:
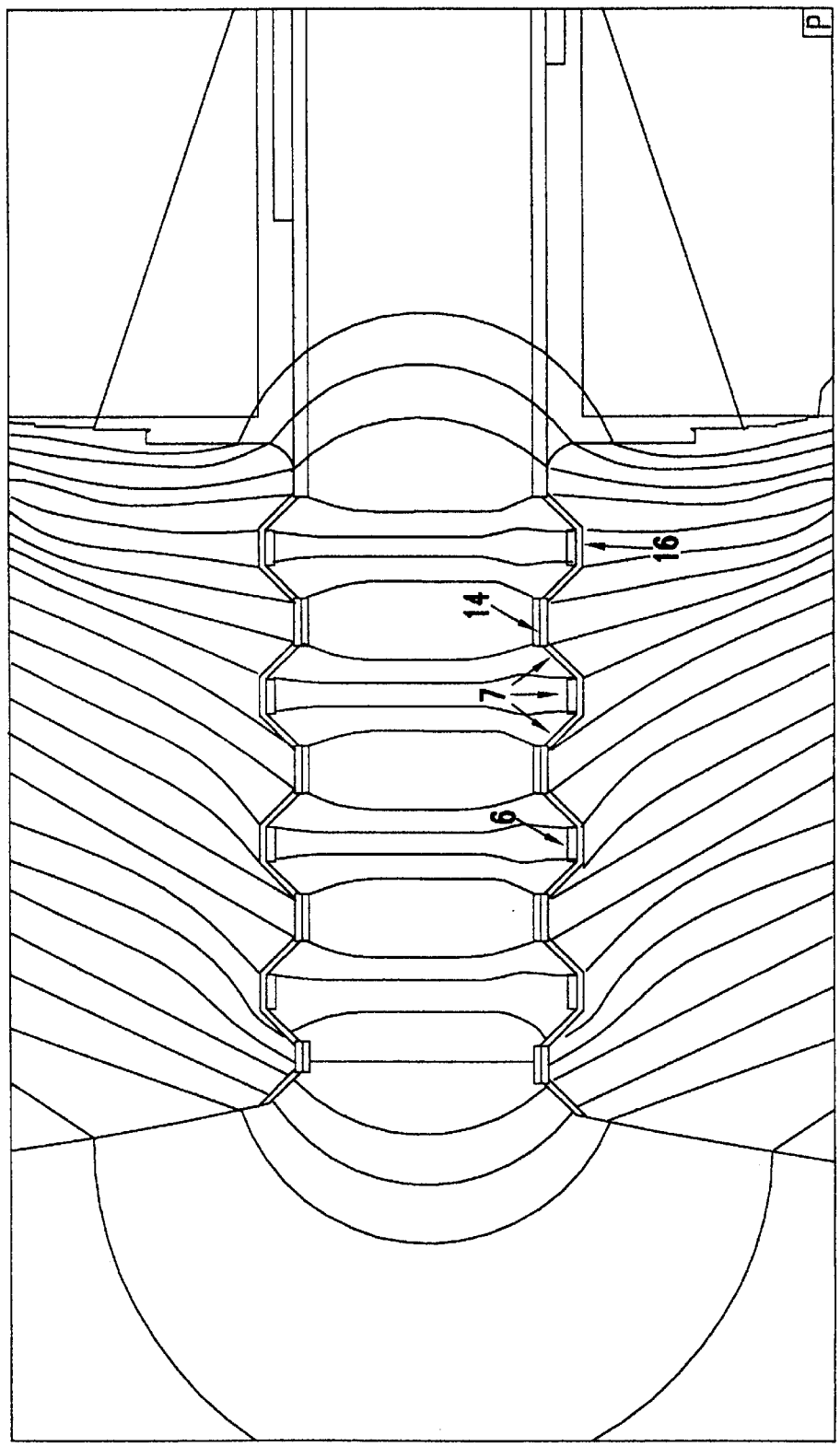

Specifically, in FIGS. 4 and 4A, the regions 16 are three times as long as the regions 14 while other dimensions are maintained the same as in the embodiments of FIGS. 1 and 2. For this geometry and pole piece profile, the mirror ratio has been increased to 1.57 while the magnetic field strength on axis (in the center of the gap) is reduced by only 12.5% relative to a known flat pole piece. Perhaps more importantly, the magnetic field at the surface of liner 22 above the convex regions 14 of the pole pieces 1 are substantially constant; thus deriving a nearly constant mirror ratio at the liner 22. Accordingly, this embodiment is preferred over the embodiments of FIGS. 1 and 2 for a liner 22 of the same thickness. The flat parts of the convex regions 14 are preferably protected by liner 22 while the tapered and flat parts of concave regions 16 are protected by electrodes or insulators 6, 7.

Figure 5:
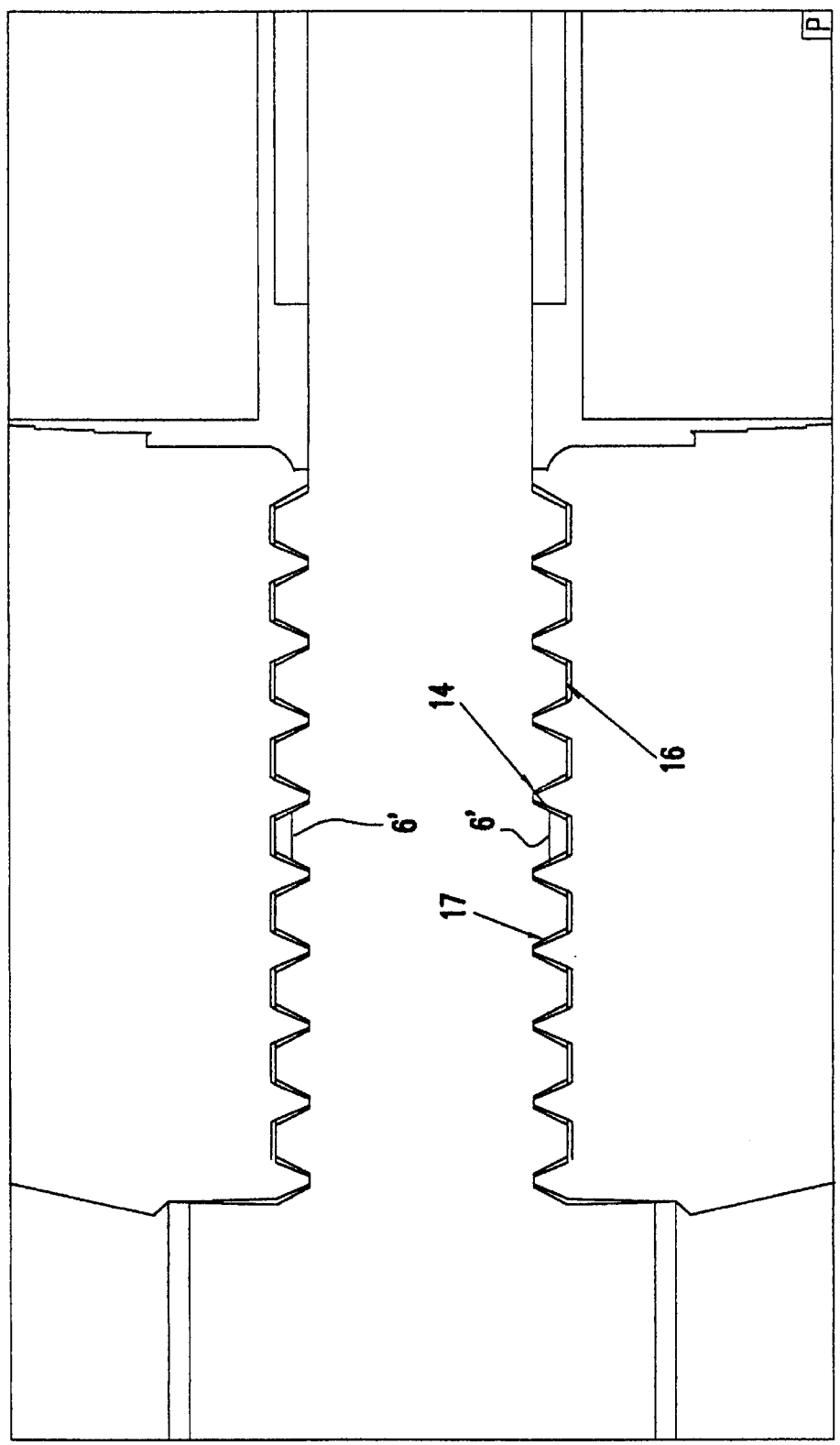
Figure 5A:
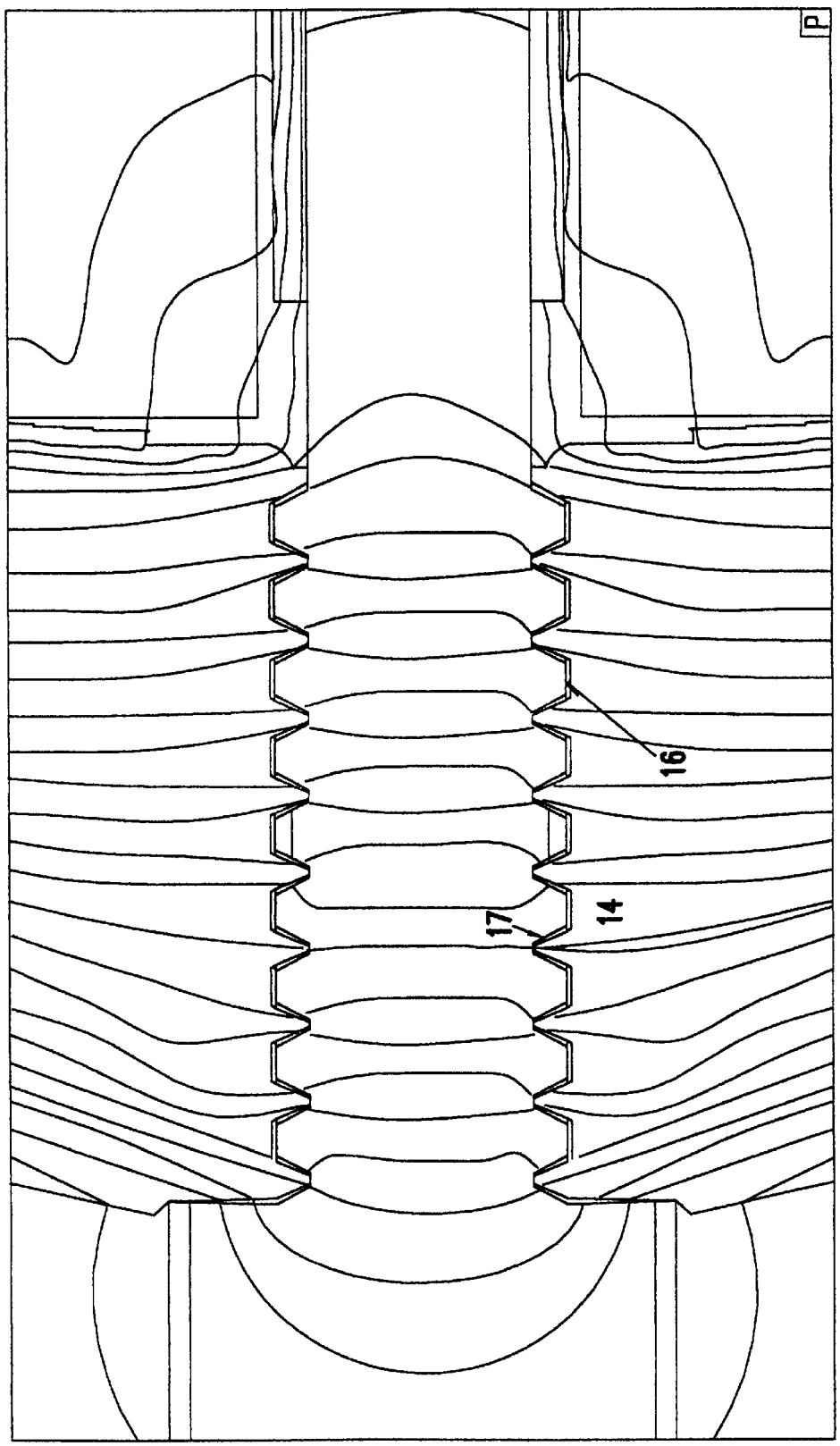

The ratio of magnet gap to pitch of regions 14 of the embodiment of FIG. 4 is 1.25. This ratio can be increased essentially at will (to lessen the reduction of on-axis field strength) by reducing the pitch of the cusps. For example, the embodiment shown in FIGS. 5 and 5A, is preferred to the embodiment of FIG. 4 but requires a thinner liner 17 as compared with liner 22. Liner 17 may be conveniently formed of Teflon (a trademark for polytetrafluoroethylene) tape or other thin insulating material or a thin insulator covered by stripes 16 of isolated conductors, such as graphite or metal tape, may be used. Negative electrodes 6 may also, optionally, be used.

For the structure shown in FIGS. 5 and 5A, the mirror ratio is 1.75 and the gap/pitch ratio is 3.0 which, again, gives a substantially constant magnetic field at the surface of liner 17. In this configuration, the average field in the center of the gap is reduced by only 4.5% compared to a flat pole face with the same minimum gap.

Figure 6:
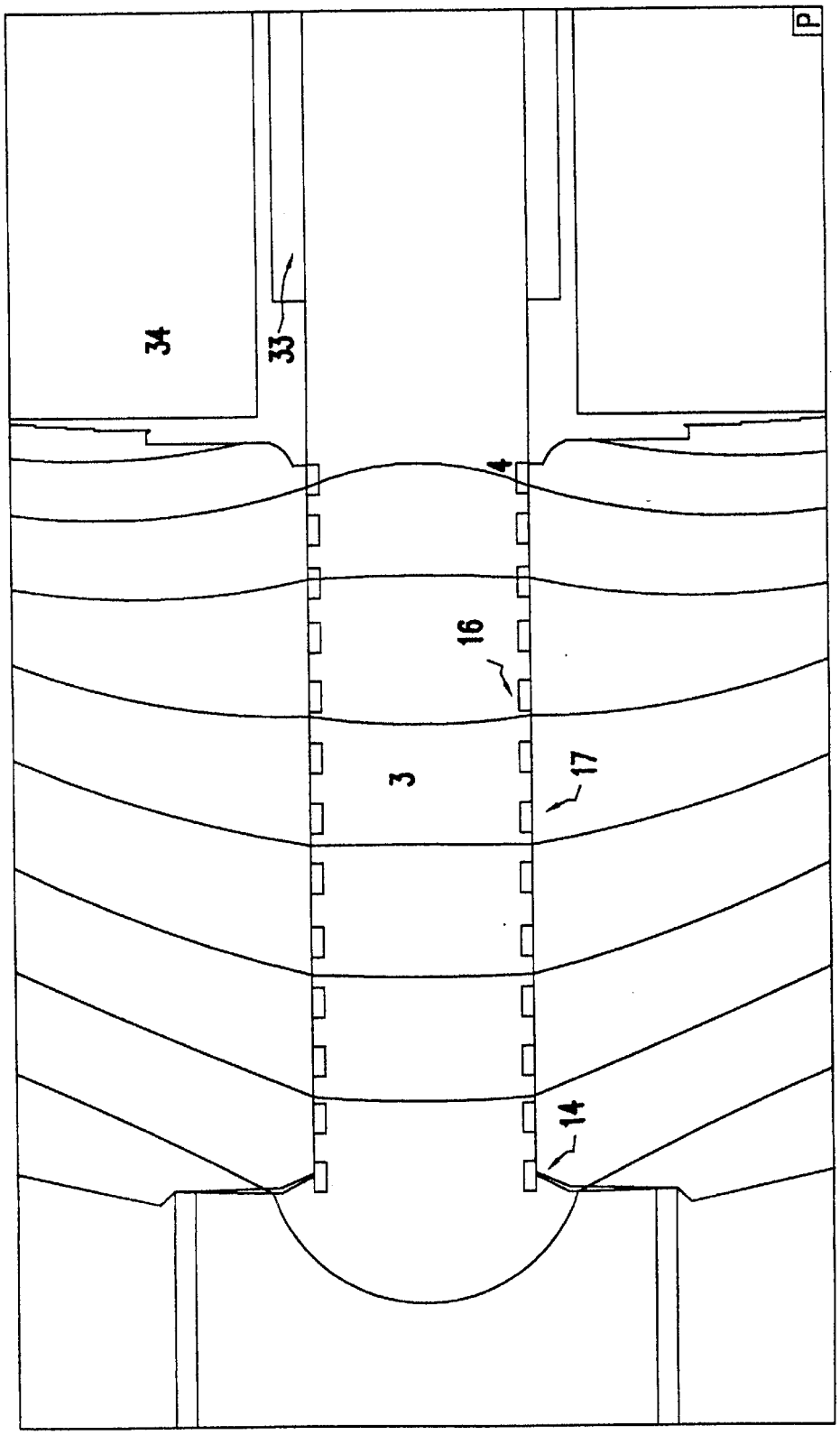
FIG. 6 illustrates a limiting case of the embodiment of FIG. 2 and the variations of FIG. 4 and 5.

The limiting case having a pitch equal to the pole face length by virtue of omission of concave regions 16 is shown in cross-section in FIG. 6. Accordingly, there is only a single cusp corresponding to the entire face of the pole pieces. This embodiment is not preferred as a matter of ion beam containment performance but may be preferred for retrofitting the invention to existing dipole magnets or in other applications where the preferred pole piece face profile and cusp geometry cannot be practically provided. Nevertheless, a substantially improved degree of beam confinement is provided by their provision of additional electrostatic confinement even in this limiting case of only a single magnetic cusp coextensive with the pole piece face.

In this case, the liner 16 must be an insulator with short sections of electrode 6 or isolated electrode 7. Here, the insulator protects the flat pole pieces and the electrode 6 or isolated electrode 7 provides additional confinement for the plasma electrons even though there is only a single cusp and magnetic confinement is effectively not enhanced. The electrode or insulator 7 will be more positive at the beginning and end of the pole piece along the ion beam path where the mirror ratio is higher and will be more negative in the falt center of the pole piece.

To generalize the embodiments of FIGS. 1, 2 and 4–6, the continuity equations for the creation of electrons and non-beam ions in the beam plasma combined with the momentum equations for the electrons and non-beam ions demonstrate that for low pressures of about $2 \times 10^{-7}$ to $2 \times 10^{-5}$ Torr which are typical for mass analysis and ion beam tools used in semiconductor manufacture, the electrons are confined principally by the inertia of the ions and the magnetic mirror confinement. Further, the total current of electrons to the walls is equal to the total current of ions to the walls.

Where the electrons are confined by the magnetic mirror fields at the magnetic cusps, the ions are not pulled out of the beam or plasma to the beam liner wall. The ions are dominantly pulled out at the negative electrodes where the electrons are more effectively confined electrostatically. The invention thus effectively reduces the area to which ions can be lost and, in turn, reduces the electron temperature and, further, reduces the number of ions that can be pulled out of the beam in those areas by confinement of the plasma electrons. By the same token, the plasma density is increased, thus further lowering the electron temperature. This confinement and reduced electron temperature thus produced in accordance with the invention reduces the electric fields which are set up in the direction of the pole faces and reduces the divergence of the ion beam.

While the invention has been described in terms of four preferred embodiments (two being particularly preferred) and a limiting case embodiment, those skilled in the art will recognize that the invention can be practiced with modification, particularly over a continuum of pole pies geometries among the disclosed embodiments within the spirit and scope of the appended claims.

For example, the profile of a concave region 16 and a convex region 14 are depicted as a pair of flat regions connected by tapered regions, forming four faces or facets for simplicity of illustration. It should be apparent that the principles of the invention are fully applicable to the use of more than four faces or, in a limiting case, a smooth curve. For another example, the concave sections may be proportionately much deeper or wider that illustrated in the exemplary embodiments discussed above.

Likewise, a particular shape of such a continuous curve or the angles of the particular faces or facets may be preferred for particular applications of the principles of the invention which differ from the exemplary embodiments specifically disclosed. All of these variations of the invention should be considered as being schematically depicted by the faces or facets illustrated in FIGS. 1, 2, and 4–6. Similarly, it should be understood that the various perfecting features such as the field clamp 33 and the use of a RF field to enhance ionization as well as various forms of liner 22 described above can be included singly or in combination with any of the embodiments disclosed.

Having thus described my invention, what I claim as new and desire to secure by Letters Patent is as follows:

1. An apparatus utilizing an ion beam and including a dipole magnet for manipulating the ion beam wherein the dipole magnet includes
   a gap between pole pieces of said dipole magnet through which the ion beam passes, and
   a plurality of means for maintaining a negative charge disposed within said gap between said pole pieces of said dipole magnet.

2. An apparatus as recited in claim 1, wherein said pole pieces include means for concentrating a magnetic field of said dipole magnet in the vicinity of said pole pieces.

3. An apparatus as recited in claim 1, wherein said plurality of means comprises
   means for providing electrostatic confinement in said gap of said dipole magnet.

4. An apparatus as recited in claim 3, wherein said pole pieces include a plurality of convex regions separated by a plurality of concave regions.

5. An apparatus as recited in claim 4, wherein said convex regions on one of said pole pieces are located opposite concave regions on another of said pole pieces.

6. An apparatus as recited in claim 4, wherein said convex regions on one of said pole pieces are located opposite convex regions on another of said pole pieces.

7. An apparatus as recited in claim 3, wherein said means for providing electrostatic confinement includes electrodes connected to a relatively negative voltage, an isolated electrode or an insulator.

8. An apparatus as recited in claim 1, further including means for enhancing ionization in said gap.

9. An apparatus as recited in claim 8, wherein said means for enhancing ionization includes a high frequency signal source.

10. An apparatus as recited in claim 9, wherein said high frequency signal source has a frequency of between about 40 MHz and 100 MHz.

11. An ion beam apparatus having a dipole magnet and a beam plasma inside a gap of said dipole magnet, said ion beam apparatus comprising
   means for increasing magnetic fields near pole faces of said dipole magnet, and
   means for electrostatically confining said beam plasma at a plurality of locations along said pole faces in a direction of ion beam travel.

12. An ion beam apparatus as recited in claim 11, wherein respective ones of said means for electrostatically confining said beam plasma are located where said magnetic field near said pole faces is reduced and between regions where said magnetic field is increased.

13. An ion beam apparatus as recited in claim 12, wherein respective ones of said means for electrostatically confining said beam plasma comprise an electrode connected to a negative voltage, an electrically isolated electrode or an insulator.

14. An ion beam apparatus as recited in claim 11, wherein respective ones of said means for electrostatically confining said beam plasma comprise an electrode connected to a negative voltage, an electrically isolated electrode or an insulator.

15. An ion beam apparatus as recited in claim 11, wherein said means for increasing said magnetic field comprise bodies of magnetic material.

16. An ion beam apparatus as recited in claim 11, wherein said means for increasing said magnetic field comprise convex portions of said pole faces.

17. An ion beam apparatus as recited in claim 11, wherein said means for increasing the magnetic field includes a plurality of means for locally increasing said magnetic field.

18. An ion beam apparatus as recited in claim 17, further including
 a liner in said gap, and wherein a spacing between respective one of said plurality of means for locally increasing said magnetic field are spaced at a pitch in accordance with a thickness of said liner.

19. An ion beam apparatus as recited in claim 11, further includes
 means for enhancing ionization of said plasma in said gap.

20. An ion beam apparatus as recited in claim 19 wherein said means for enhancing ionization further includes a generator of a signal having a frequency in the range of 40 MHz to 100 MHz.

21. A method of reducing divergence of an ion beam in a dipole magnet, said method comprising steps of
 increasing a magnetic field of said dipole magnet in a region near pole faces of said dipole magnet, and
 electrostatically confining a beam plasma at a location along said pole faces in a direction of ion beam travel where said magnetic field is reduced.

22. A method as recited in claim 21, wherein said step of electrostatically confining a beam plasma includes a step of
 developing a charge on an isolated electrode or an insulator by accumulation of electrons from said beam plasma.

23. A method as recited in claim 21, including the further step of
 enhancing ionization between said pole faces of said dipole magnet.

* * * * *